(12) United States Patent
Cheng et al.

(10) Patent No.: US 12,148,504 B2
(45) Date of Patent: Nov. 19, 2024

(54) RANDOM DATA GENERATION CIRCUIT AND READ/WRITE TRAINING CIRCUIT

(71) Applicant: Changxin Memory Technologies, Inc., Anhui (CN)

(72) Inventors: Biao Cheng, Hefei (CN); Tianchen Lu, Hefei (CN)

(73) Assignee: Changxin Memory Technologies, Inc., Hefei (CN)

( * ) Notice: Subject to any disclaimer, the term of this patent is extended or adjusted under 35 U.S.C. 154(b) by 210 days.

(21) Appl. No.: 18/093,728

(22) Filed: Jan. 5, 2023

(65) Prior Publication Data
US 2023/0420005 A1 Dec. 28, 2023

Related U.S. Application Data

(63) Continuation of application No. PCT/CN2022/103573, filed on Jul. 4, 2022.

(30) Foreign Application Priority Data

Jun. 22, 2022 (CN) .......................... 202210711838.6

(51) Int. Cl.
*G11C 7/10* (2006.01)
*G06F 7/58* (2006.01)
(Continued)

(52) U.S. Cl.
CPC ............ *G11C 7/1036* (2013.01); *G06F 7/588* (2013.01); *G11C 7/222* (2013.01); *H03K 19/21* (2013.01)

(58) Field of Classification Search
CPC ...... G11C 7/1036; G11C 7/222; H03K 19/21; G06F 7/588
See application file for complete search history.

(56) References Cited

U.S. PATENT DOCUMENTS 5,566,099 A * 10/1996 Shimada .................. H04L 9/12
  708/250
9,547,475 B2 * 1/2017 Yasuda .................. G06F 7/588
(Continued)

FOREIGN PATENT DOCUMENTS

CN   103257846 A   8/2013
CN   105138306 A   12/2015
(Continued)

OTHER PUBLICATIONS

PCT International Search Report and the Written Opinion mailed Dec. 19, 2022, issued in related International Application No. PCT/CN2022/103573 (17 pages).

*Primary Examiner* — Son L Mai
(74) *Attorney, Agent, or Firm* — Sheppard Mullin Richter & Hampton LLP

(57) ABSTRACT

A random data generation circuit includes: a first shift register and a second shift register. The first shift register includes n output ends Q1 to Qn, the second shift register includes n output ends Qn+1 to Q2n, and each of the output ends outputs 1-bit data in a clock cycle of a clock signal; and a parallel-to-serial circuit, coupled to the output ends Q1 to Q2n and configured to convert parallel data output from Q1 to Q2n in a clock cycle into serial data for output. An initial value of the first shift register is different from an initial value of the second shift register. Data may be generated in parallel by using two shift registers, and the parallel data generated by the two shift registers is converted into serial data by using the parallel-to-serial circuit to be output.

17 Claims, 9 Drawing Sheets

(51) Int. Cl.
*G11C 7/22* (2006.01)
*H03K 19/21* (2006.01)

(56) References Cited

U.S. PATENT DOCUMENTS

| | | | |
|---|---|---|---|
| 10,600,493 | B2 | 3/2020 | Ku |
| 2003/0074380 | A1* | 4/2003 | Shona .................... G06F 7/588 |
| | | | 708/250 |
| 2014/0143292 | A1 | 5/2014 | Yasuda et al. |

FOREIGN PATENT DOCUMENTS

| | | | |
|---|---|---|---|
| CN | 105404495 A | 3/2016 |
| CN | 106452449 A | 2/2017 |
| CN | 110556154 A | 12/2019 |
| CN | 112162946 A | 1/2021 |

* cited by examiner

RANDOM DATA GENERATION CIRCUIT AND READ/WRITE TRAINING CIRCUIT

CROSS-REFERENCE TO RELATED APPLICATIONS

This application is a continuation application of International Patent Application No. PCT/CN2022/103573, filed on Jul. 4, 2022, which claims priority to Chinese Patent Application No. 202210711838.6, filed with the China National Intellectual Property Administration on Jun. 22, 2022 and entitled "RANDOM DATA GENERATION CIRCUIT AND READ/WRITE TRAINING CIRCUIT". The above-referenced applications are incorporated herein by reference in their entirety.

TECHNICAL FIELD

Embodiments of this invention relate to the field of semiconductor technologies, and in particular, to a random data generation circuit and a read/write training circuit.

BACKGROUND

A data storage circuit is configured to store data and provide a data reading/writing function to an external device. To ensure that the data reading/writing function is operational, read/write training needs to be performed on a data processing circuit by using a clock signal CLK1 and training data. The data processing circuit may be an internal memory, for example, a DDR (double data rate) SDRAM (synchronous dynamic random access memory).

In the prior art, training data may be generated by using an LFSR (linear feedback shift register), for read/write training on the internal memory. An LFSR circuit includes a plurality of DFFs (D type flip-flop). Each DFF accesses a clock signal CLK2, so that each time the CLK2 is switched, one of the flip-flops outputs data as generated data.

However, the LFSR circuit generates data at a relatively low speed.

SUMMARY

Embodiments of this invention provide a random data generation circuit and a read/write training circuit, to improve data generation speed.

According to one aspect, an embodiment of this invention provides a random data generation circuit, including: a first shift register and a second shift register, configured to receive a same clock signal, where the first shift register includes n output ends Q1 to Qn, the second shift register includes n output ends Qn+1 to Q2n, each of the output ends outputs 1-bit data in a clock cycle of the clock signal, and n is an integer greater than or equal to 1; and a parallel-to-serial circuit, coupled to the output ends of the first shift register and the output ends of the second shift register and configured to convert parallel data output by the output ends Q1 to Q2n in one clock cycle into serial data for output, where an initial value of the first shift register is different from an initial value of the second shift register.

In some embodiments, the first shift register is the same as the second shift register.

In some embodiments, each of the first shift register and the second shift register includes m flip-flops and m data processing circuits, a data input end of each of the flip-flops is correspondingly connected to an output end of one data processing circuit, a trigger input end of each of the flip-flops is configured to receive the clock signal, each of the data processing circuits is configured to perform logical processing on output data of at least one flip-flop, output ends of n flip-flops in the first shift register are respectively used as the n output ends of the first shift register, output ends of n flip-flops in the second shift register are respectively used as the n output ends of the second shift register, m is a positive integer greater than or equal to n, the initial value of the first shift register includes an initial value of the data input ends of the flip-flops in the first shift register, and the initial value of the second shift register includes an initial value of the data input ends of the flip-flops in the second shift register.

In some embodiments, m is 8 and n is 4.

In some embodiments, the eight flip-flops of the first shift register are successively denoted as a first flip-flop to an eighth flip-flop, the eight data processing circuits of the first shift register are successively denoted as a first data processing circuit to an eighth data processing circuit, and output ends of the first flip-flop to the fourth flip-flop are successively denoted as the output ends Q1 to Q4; and the eight flip-flops of the second shift register are successively denoted as a ninth flip-flop to a sixteenth flip-flop, the eight data processing circuits of the second shift register are successively denoted as a ninth data processing circuit to a sixteenth data processing circuit, and output ends of the ninth flip-flop to the twelfth flip-flop are successively denoted as the output ends Q5 to Q8.

In some embodiments, the first data processing circuit has three input ends, which are respectively connected to the output ends of the third flip-flop to the fifth flip-flop and configured to perform exclusive OR processing on input data received by the three input ends of the first data processing circuit; and the ninth data processing circuit has three input ends, which are respectively connected to the output ends of the eleventh flip-flop to the thirteenth flip-flop and configured to perform exclusive OR processing on input data received by the three input ends of the ninth data processing circuit.

In some embodiments, the second data processing circuit has three input ends, which are respectively connected to the output ends of the fourth flip-flop to the sixth flip-flop and configured to perform exclusive OR processing on input data received by the three input ends of the second data processing circuit; and the tenth data processing circuit has three input ends, which are respectively connected to the output ends of the twelfth flip-flop to the fourteenth flip-flop and configured to perform exclusive OR processing on input data received by the three input ends of the tenth data processing circuit.

In some embodiments, the third data processing circuit has four input ends, which are respectively connected to the output ends of the first flip-flop and the fifth flip-flop to the seventh flip-flop and configured to perform exclusive OR processing on input data received by the four input ends of the third data processing circuit; and the eleventh data processing circuit has four input ends, which are respectively connected to the output ends of the ninth flip-flop and the thirteenth flip-flop to the fifteenth flip-flop and configured to perform exclusive OR processing on input data received by the four input ends of the eleventh data processing circuit.

In some embodiments, the fourth data processing circuit has four input ends, which are respectively connected to the output ends of the second flip-flop and the sixth flip-flop to the eighth flip-flop and configured to perform exclusive OR processing on input data received by the four input ends of the fourth data processing circuit; and the twelfth data processing circuit has four input ends, which are respectively connected to the output ends of the tenth flip-flop and the fourteenth flip-flop to the sixteenth flip-flop and configured to perform exclusive OR processing on input data received by the four input ends of the twelfth data processing circuit.

In some embodiments, the fifth data processing circuit has four input ends, which are respectively connected to the output ends of the fourth flip-flop, the fifth flip-flop, the seventh flip-flop, and the eighth flip-flop and configured to perform exclusive OR processing on input data received by the four input ends of the fifth data processing circuit; and the thirteenth data processing circuit has four input ends, which are respectively connected to the output ends of the twelfth flip-flop, the thirteenth flip-flop, the fifteenth flip-flop, and the sixteenth flip-flop and configured to perform exclusive OR processing on input data received by the four input ends of the thirteenth data processing circuit.

In some embodiments, the sixth data processing circuit has five input ends, which are respectively connected to the output ends of the first flip-flop, the third flip-flop, the fourth flip-flop, the sixth flip-flop, and the eighth flip-flop and configured to perform exclusive OR processing on input data received by the five input ends of the sixth data processing circuit; and the fourteenth data processing circuit has five input ends, which are respectively connected to the output ends of the ninth flip-flop, the eleventh flip-flop, the twelfth flip-flop, the fourteenth flip-flop, and the sixteenth flip-flop and configured to perform exclusive OR processing on input data received by the five input ends of the fourteenth data processing circuit.

In some embodiments, the seventh data processing circuit has four input ends, which are respectively connected to the output ends of the first flip-flop to the third flip-flop and the seventh flip-flop and configured to perform exclusive OR processing on input data received by the four input ends of the seventh data processing circuit; and the fifteenth data processing circuit has four input ends, which are respectively connected to the output ends of the ninth flip-flop to the eleventh flip-flop and the fifteenth flip-flop and configured to perform exclusive OR processing on input data received by the four input ends of the fifteenth data processing circuit.

In some embodiments, the eighth data processing circuit has four input ends, which are respectively connected to the output ends of the second flip-flop to the fourth flip-flop and the eighth flip-flop and configured to perform exclusive OR processing on input data received by the four input ends of the eighth data processing circuit; and the sixteenth data processing circuit has four input ends, which are respectively connected to the output ends of the tenth flip-flop to the twelfth flip-flop and the sixteenth flip-flop and configured to perform exclusive OR processing on input data received by the four input ends of the sixteenth data processing circuit.

In some embodiments, data output by both the first shift register and the second shift register repeatedly appears in units of $2^{(m-1)}$ bits.

In some embodiments, an initial value of the data input end of the ninth flip-flop is a result of exclusive OR operation for an initial value of the data input end of the first flip-flop and an initial value of the data input end of the fifth flip-flop; an initial value of the data input end of the tenth flip-flop is a result of exclusive OR operation for the initial value of the data input end of the first flip-flop, an initial value of the data input end of the second flip-flop, and an initial value of the data input end of the sixth flip-flop; an initial value of the data input end of the eleventh flip-flop is a result of exclusive OR operation for the initial value of the data input end of the first flip-flop, the initial value of the data input end of the second flip-flop, an initial value of the data input end of the third flip-flop, and an initial value of the data input end of the seventh flip-flop; an initial value of the data input end of the twelfth flip-flop is a result of exclusive OR operation for the initial value of the data input end of the second flip-flop, the initial value of the data input end of the third flip-flop, an initial value of the data input end of the fourth flip-flop, and an initial value of the data input end of the eighth flip-flop; an initial value of the data input end of the thirteenth flip-flop is a result of exclusive OR operation for the initial value of the data input end of the first flip-flop, the initial value of the data input end of the third flip-flop, and the initial value of the data input end of the fourth flip-flop; an initial value of the data input end of the fourteenth flip-flop is a result of exclusive OR operation for the initial value of the data input end of the second flip-flop and the initial value of the data input end of the fourth flip-flop; an initial value of the data input end of the fifteenth flip-flop is the initial value of the data input end of the third flip-flop; and an initial value of the data input end of the sixteenth flip-flop is the initial value of the data input end of the fourth flip-flop.

According to another aspect, an embodiment of this invention provides a read/write training circuit, including a data storage circuit and the foregoing random data generation circuit. The parallel-to-serial circuit in the random data generation circuit is connected to the data storage circuit and configured to input data generated by the random data generation circuit to the data storage circuit for read/write training.

In some embodiments, the data storage circuit is an internal memory of DDR5.

According to the random data generation circuit and the read/write training circuit provided in the embodiments of this invention, the first shift register and the second shift register may generate data in parallel, and the parallel data generated by the first shift register and the second shift register are converted into serial data by using the parallel-to-serial circuit to be output. In this way, each time the clock signal CLK2 is switched, at least 2 bits of data may be output, which improves a data generation speed.

DESCRIPTION OF EMBODIMENTS

The following describes the technical solutions in the embodiments of this invention with reference to the accompanying drawings in the embodiments of this invention. Apparently, the described embodiments are merely some rather than all of the embodiments of this invention. Based on the embodiments of this invention, all other embodiments obtained by a person of ordinary skill in the art without creative efforts fall within the protection scope of this application.

Terms "first" and "second" in the specification and claims of this application, and the foregoing accompanying drawings are used to distinguish between similar objects, and do not need to be used to describe a specific order or sequence. It should be understood that data used in this way may be interchangeable in appropriate cases, so that the embodiments of this invention described herein can be implemented in a sequence other than those shown or described herein.

In addition, terms "include", "have", and any modification thereof are intended to cover non-exclusive inclusion, for example, processes, methods, systems, products, or devices that contain a series of steps or units are not necessarily limited to those steps or units that are clearly listed, but may include other steps or units that are not clearly listed or are inherent to these processes, methods, products, or devices.

Figure 1:
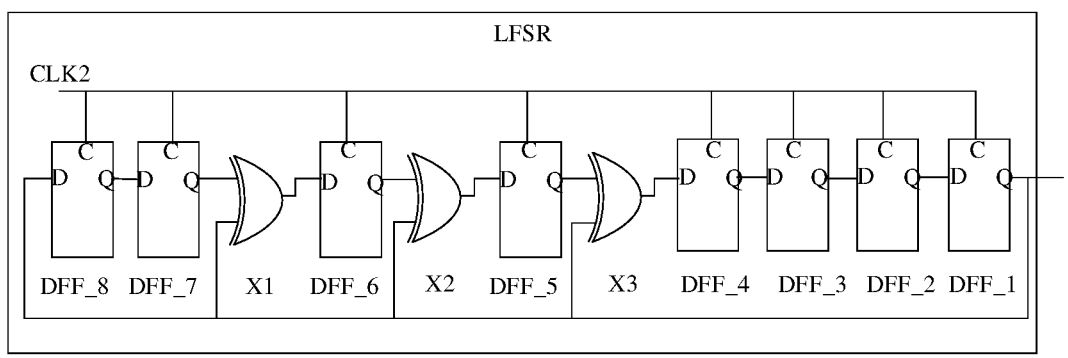
FIG. 1 is a schematic diagram of a structure of an LFSR circuit according to an embodiment of this invention.

FIG. 1 is a schematic diagram of a structure of an LFSR circuit according to an embodiment of this invention. As shown in FIG. 1, the LFSR circuit includes eight DFFs: a DFF_1 to a DFF_8, and exclusive-OR gates X1 to X3. Each DFF has a data input end D, a trigger input end C, and an output end Q, and a clock signal CLK2 accesses the trigger input end C of each DFF. In addition, each DFF further correspondingly has a reset input end, configured to reset data at the data input end D of the DFF. The reset input end is not shown in FIG. 1 because this embodiment of this invention does not involve an operation on the reset input end.

The output end Q of the DFF_1 is connected to the data input end D of the DFF_8, so that each time the clock signal CLK2 is switched, data at the data input end D of the DFF_1 is input to the data input end D of the DFF_8.

The output end Q of the DFF_8 is connected to the data input end D of the DFF_7, so that each time the clock signal CLK2 is switched, data at the data input end D of the DFF_8 is input to the data input end D of the DFF_7.

Both the output end Q of the DFF_7 and the output end Q of the DFF_1 are connected to an input end of the exclusive-OR gate X1, and an output end of the exclusive-OR gate X1 is connected to the data input end D of the DFF_6, so that each time the clock signal CLK2 is switched, a result of exclusive OR operation for data at the data input end D of the DFF_7 and data at the data input end D of the DFF_1 is input to the data input end D of the DFF_6.

Both the output end Q of the DFF_6 and the output end Q of the DFF_1 are connected to an input end of the exclusive-OR gate X2, and an output end of the exclusive-OR gate X2 is connected to the data input end D of the DFF_5, so that each time the clock signal CLK2 is switched, a result of exclusive OR operation for data at the data input end D of the DFF_6 and data at the data input end D of the DFF_1 is input to the data input end D of the DFF_5.

Both the output end Q of the DFF_5 and the output end Q of the DFF_1 are connected to an input end of the exclusive-OR gate X3, and an output end of the exclusive-OR gate X3 is connected to the data input end D of the DFF_4, so that each time the clock signal CLK2 is switched, a result of exclusive OR operation for data at the data input end D of the DFF_5 and data at the data input end D of the DFF_1 is input to the data input end D of the DFF_4.

The output end Q of the DFF_4 is connected to the data input end D of the DFF_3, so that each time the clock signal CLK2 is switched, data at the data input end D of the DFF_4 is input to the data input end D of the DFF_3.

The output end Q of the DFF_3 is connected to the data input end D of the DFF_2, so that each time the clock signal CLK2 is switched, data at the data input end D of the DFF_3 is input to the data input end D of the DFF_2.

The output end Q of the DFF_2 is connected to the data input end D of the DFF_1, so that each time the clock signal CLK2 is switched, data at the data input end D of the DFF_2 is input to the data input end D of the DFF_1.

In an initial state, the data input end D of each DFF has a preset data value, and these preset data values may be randomly set, so that generated data is also random data. When training data is generated, each time the CLK2 is switched, input data of each DFF is shifted once based on the foregoing relationship. Data output by the output end Q of the DFF_1 is used as data generated by the LFSR circuit.

It may be learned from the LFSR structure shown in FIG. 1 that, in a current clock cycle, data at the data input end D of the DFF_8 is data at the data input end D of the DFF_1 in a previous clock cycle, data at the data input end D of the DFF_7 is data at the data input end D of the DFF_8 in the previous clock cycle, data at the data input end D of the DFF_6 is a result of exclusive OR operation for data at the data input ends D of the DFF_1 and the DFF_7 in the previous clock cycle, data at the data input end D of the DFF_5 is a result of exclusive OR operation for data at the data input ends D of the DFF_1 and the DFF_6 in the previous clock cycle, data at the data input end D of the DFF_4 is a result of exclusive OR operation for data at the data input ends D of the DFF_1 and the DFF_5 in the previous clock cycle, data at the data input end D of the DFF_3 is data at the data input end D of the DFF_4 in the previous clock cycle, data at the data input end D of the DFF_2 is data at the data input end D of the DFF_3 in the previous clock cycle, and data at the data input end D of the DFF_1 is data at the data input end D of the DFF_2 in the previous clock cycle.

Data at the data input ends D of the flip-flops in the LFSR shown in FIG. 1 in any clock cycle may be determined based on the foregoing relationship.

Figure 2:
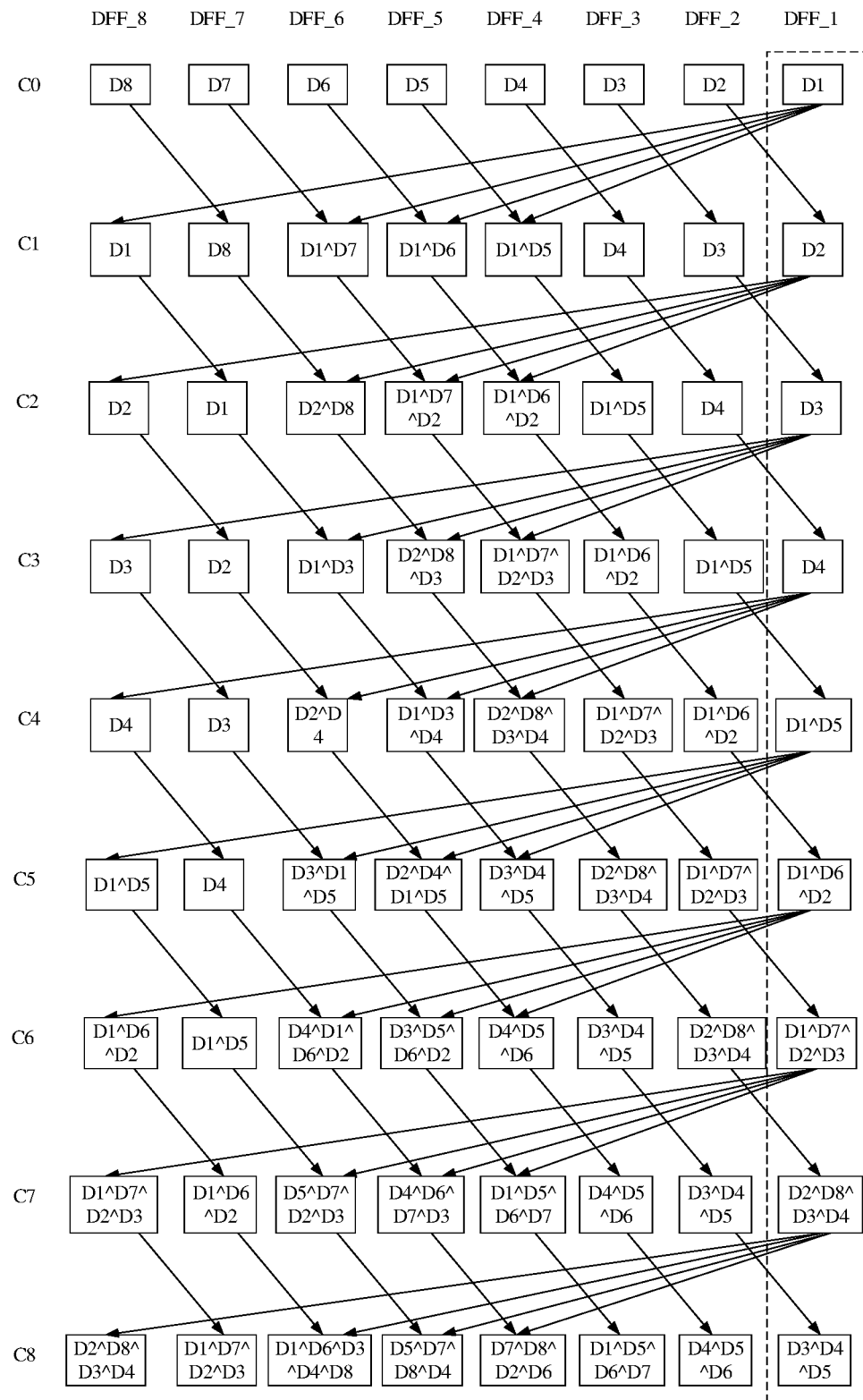
FIG. 2 is a schematic diagram of data at data input ends of flip-flops in the LFSR circuit shown in FIG. 1 in different clock cycles according to an embodiment of this invention.

As shown in FIG. 2, C0 may be an initial state. In the initial state C0, data at the data input ends D of the first flip-flop DFF_1 to the eighth flip-flop DFF_8 may be respectively denoted as D1 to D8. FIG. 2 shows a relationship between data at the data input ends D of the flip-flops in remaining clock cycles C1 to C8 and the data D1 to D8 in the initial state. Data at the data input ends D of the flip-flops in each clock cycle is determined by data at the data input ends D of the flip-flops in a previous clock cycle. For example, data at the data input end D of the DFF_8 in C1 is the same as data at the data input end D of the DFF_1 in a previous clock cycle C0. For another example, the DFF_6 in C1 stores a result of exclusive OR operation for data at the data input ends D of the DFF_7 and the DFF_1 in C0. In this way, data at the data input ends D of the flip-flops in the following C1 to C8 may be obtained based on relationships that are between data at the data input ends D of the flip-flops in adjacent clock cycles and that are indicated by arrows in FIG. 2.

In a next clock cycle C1, data at the data input ends D of the first flip-flop DFF_1 to the eighth flip-flop DFF_8 is respectively D2, D3, D4, D1^D5, D1^D6, D1^D7, D8, and D1, where ^ is an exclusive OR operation.

In a next clock cycle C2, data at the data input ends D of the first flip-flop DFF_1 to the eighth flip-flop DFF_8 is respectively D3, D4, D1^D5, D1^D6^D2, D1^D7^D2, D2^D8, D1, and D2.

In a next clock cycle C3, data at the data input ends D of the first flip-flop DFF_1 to the eighth flip-flop DFF_8 is respectively D4, D1^D5, D1^D6^D2, D1^D7^D2^D3, D2^D8^D3, D1^D3, D2, and D3.

In a next clock cycle C4, data at the data input ends D of the first flip-flop DFF_1 to the eighth flip-flop DFF_8 is respectively D1^D5, D1^D6^D2, D1^D7^D2^D3, D2^D8^D3^D4, D1^D3^D4, D2^D4, D3, and D4.

In a next clock cycle C5, data at the data input ends D of the first flip-flop DFF_1 to the eighth flip-flop DFF_8 is respectively D1^D6^D2, D1^D7^D2^D3, D2^D8^D3^D4, D3^D4^D5, D2^D4^D1^D5, D3^D1^D5, D4, and D1^D5.

In a next clock cycle C6, data at the data input ends D of the first flip-flop DFF_1 to the eighth flip-flop DFF_8 is respectively D1^D7^D2^D3, D2^D8^D3^D4, D3^D4^D5, D4^D5^D6, D3^D5^D6^D2, D4^D1^D6^D2, D1^D5, and D1^D6^D2.

In a next clock cycle C7, data at the data input ends D of the first flip-flop DFF_1 to the eighth flip-flop DFF_8 is respectively D2^D8^D3^D4, D3^D4^D5, D4^D5^D6, D1^D5^D6^D7, D4^D6^D7^D3, D5^D7^D2^D3, D1^D6^D2, and D1^D7^D2^D3.

In a next clock cycle C8, data at the data input ends D of the first flip-flop DFF_1 to the eighth flip-flop DFF_8 is respectively D3^D4^D5, D4^D5^D6, D1^D5^D6^D7, D7^D8^D2^D6, D5^D7^D8^D4, D1^D6^D3^D4^D8, D1^D7^D2^D3, and D2^D8^D3^D4.

Therefore, data at the data input end D of the DFF_1 is successively output based on the nine clock cycles C0 to C8 shown in FIG. 2, to obtain 9 bits of output data: D1, D2, D3, D4, D1^D5, D1^D6^D2, D1^D7^D2^D3, D2^D8^D3^D4, and D3^D4^D5.

Figure 3:
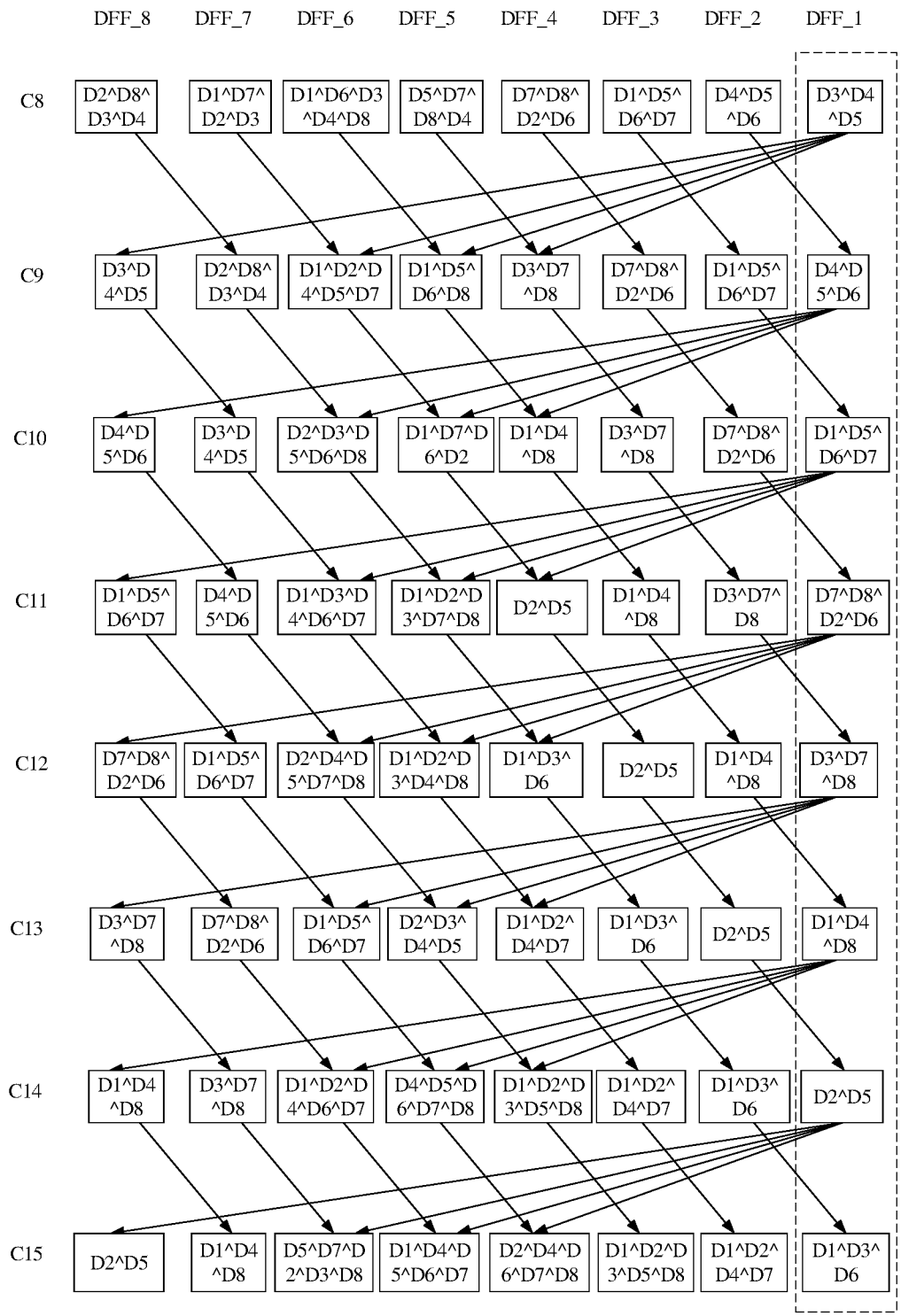
FIG. 3 is another schematic diagram of data at data input ends of flip-flops in the LFSR shown in FIG. 1 in different clock cycles according to an embodiment of this invention.

In some embodiments, data may continue to be output based on switching of the clock signal. FIG. 3 is another schematic diagram of data at data input ends D of flip-flops in the LFSR shown in FIG. 1 in different clock cycles according to an embodiment of this invention.

As shown in FIG. 3, in a clock cycle C9, data at the data input ends D of the first flip-flop DFF_1 to the eighth flip-flop DFF_8 is respectively D4^D5^D6, D1^D5^D6^D7, D7^D8^D2^D6, D3^D7^D8, D1^D5^D6^D8, D1^D2^D4^D5^D7, D2^D8^D3^D4, and D3^D4^D5.

In a clock cycle C10, data at the data input ends D of the first flip-flop DFF_1 to the eighth flip-flop DFF_8 is respectively D1^D5^D6^D7, D7^D8^D2^D6, D3^D7^D8, D1^D4^D8, D1^D7^D6^D2, D2^D3^D5^D6^D8, D3^D4^D5, and D4^D5^D6.

In a clock cycle C11, data at the data input ends D of the first flip-flop DFF_1 to the eighth flip-flop DFF_8 is respectively D7^D8^D2^D6, D3^D7^D8, D1^D4^D8, D2^D5, D1^D2^D3^D7^D8, D1^D3^D4^D6^D7, D4^D5^D6, and D1^D5^D6^D7.

In a clock cycle C12, data at the data input ends D of the first flip-flop DFF_1 to the eighth flip-flop DFF_8 is respectively D3^D7^D8, D1^D4^D8, D2^D5, D1^D3^D6, D1^D2^D3^D4^D8, D2^D4^D5^D7^D8, D1^D5^D6^D7, and D7^D8^D2^D6.

In a clock cycle C13, data at the data input ends D of the first flip-flop DFF_1 to the eighth flip-flop DFF_8 is respectively D1^D4^D8, D2^D5, D1^D3^D6, D1^D2^D4^D7, D2^D3^D4^D5, D1^D5^D6^D7, D7^D8^D2^D6, and D3^D7^D8.

In a clock cycle C14, data at the data input ends D of the first flip-flop DFF_1 to the eighth flip-flop DFF_8 is respectively D2^D5, D1^D3^D6, D1^D2^D4^D7, D1^D2^D3^D5^D8, D4^D5^D6^D7^D8, D1^D2^D4^D6^D7, D3^D7^D8, and D1^D4^D8.

In a clock cycle C15, data at the data input ends D of the first flip-flop DFF_1 to the eighth flip-flop DFF_8 is respectively D1^D3^D6, D1^D2^D4^D7, D1^D2^D3^D5^D8, D2^D4^D6^D7^D8, D1^D4^D5^D6^D7, D5^D7^D2^D3^D8, D1^D4^D8, and D2^D5.

It may be learned that the LFSR circuit in FIG. 1 has only one output end to output data, so that a data generation speed is consistent with a frequency of the clock signal CLK2. Each time the clock signal CLK2 is switched, 1-bit data is output, and a data generation speed is relatively low.

To resolve the foregoing problem, in the embodiments of this invention, data may be generated in parallel by using two shift registers, and the parallel data generated by the two shift registers is converted into serial data by using a parallel-to-serial circuit to be output. In this way, each time the clock signal CLK2 is switched, at least 2 bits of data may be output, which improves a data generation speed.

The technical solutions in the embodiments of this invention and how to resolve the foregoing technical problem by using the technical solutions in this invention are described below in detail by using specific embodiments. The following several specific embodiments may be combined with each other. For same or similar concepts or processes, details may be not described in some embodiments. The embodiments of this invention are described below with reference to the accompanying drawings.

Figure 4:
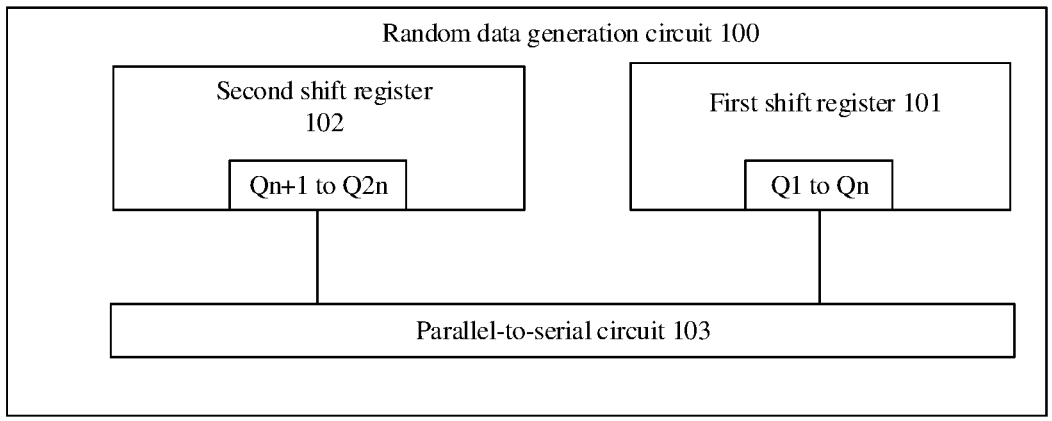
FIG. 4 is a schematic diagram of a structure of a random data generation circuit according to an embodiment of this invention.

FIG. 4 is a schematic diagram of a structure of a random data generation circuit according to an embodiment of this invention. Referring to FIG. 4, a random data generation circuit 100 includes a first shift register 101, a second shift register 102, and a parallel-to-serial circuit 103, and the parallel-to-serial circuit 103 is coupled to the first shift register 101 and the second shift register 102.

Each of the first shift register 101 and the second shift register 102 has n output ends. The n output ends of the first shift register 101 may be denoted as Q1 to Qn, and the n output ends of the second shift register 102 may be denoted as Qn+1 to Q2n, where n is an integer greater than or equal to 1.

The first shift register 101 and the second shift register 102 receive a same clock signal CLK2. Each time the clock signal CLK2 is switched, the first shift register 101 outputs, in parallel, data generated in a clock cycle to the parallel-to-serial circuit 103 by using the output ends Q1 to Qn, and the second shift register 102 outputs, in parallel, data generated in a clock cycle to the parallel-to-serial circuit 103 by using the output ends Qn+1 to Q2n. The parallel-to-serial circuit 103 converts the parallel data of the two shift registers into serial data for output, and the serial data output by the parallel-to-serial circuit 103 is data generated by the random data generation circuit 100.

It should be noted that, each of the output ends outputs 1-bit data in a clock cycle of the clock signal CLK2. Therefore, in a clock cycle, the first shift register 101 and the second shift register 102 separately output n bits of data, and the random data generation circuit 100 generates 2n bits of data in a clock cycle. It may be learned that a speed of generating data by the random data generation circuit 100 shown in FIG. 4 is 2n times that of generating data by the LFSR shown in FIG. 1.

Based on the foregoing output ends, that the parallel-to-serial circuit 103 is coupled to the first shift register 101 may be that the parallel-to-serial circuit 103 is coupled to the output ends of the first shift register 101, and that the parallel-to-serial circuit 103 is coupled to the second shift register 102 may be that the parallel-to-serial circuit 103 is coupled to the output ends of the second shift register 102. Therefore, the parallel-to-serial circuit 103 may convert parallel data output by the output ends Q1 to Q2n in a clock cycle into serial data for output.

Certainly, an initial value of the first shift register 101 is different from an initial value of the second shift register 102. In this way, data output by the first shift register 101 is different from data output by the second shift register 102, which improves diversity of data generated by the random data generation circuit 100. Initial values of data input ends D of the first shift register 101 and the second shift register 102 may be randomly set, so that data generated by the random data generation circuit 100 is random data.

The first shift register 101 and the second shift register 102 may be the same or different. The "same" or "different" herein means that structures are the same or different. When the first shift register 101 is the same as the second shift register 102, complexity of the random data generation circuit 100 may be reduced. Therefore, when the random data generation circuit 100 is produced, shift registers with only one structure need to be used, which can reduce production costs of the random data generation circuit 100. In addition, shift registers with a same structure are convenient for maintenance, which reduces maintenance costs.

Figure 5:
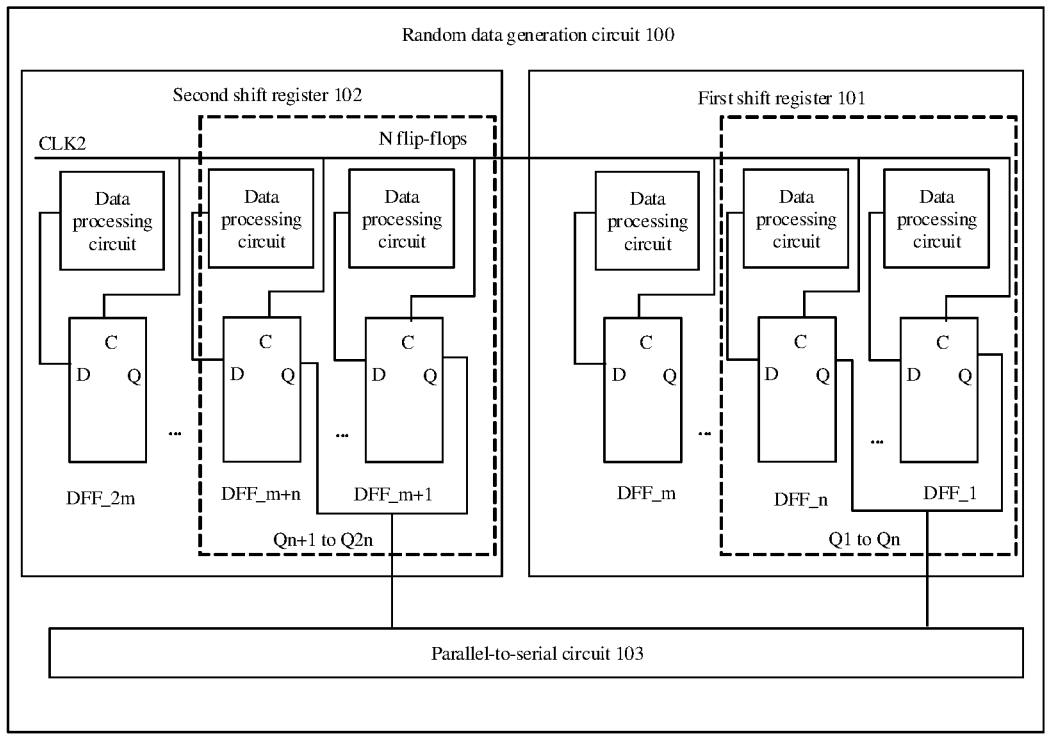
FIG. 5 is a schematic diagram of a structure of another random data generation circuit according to an embodiment of this invention.

To enable the first shift register 101 and the second shift register 102 to generate data, the first shift register 101 and the second shift register 102 may be formed by using flip-flops. FIG. 5 is a schematic diagram of a structure of another random data generation circuit 100 according to an embodiment of this invention. As shown in FIG. 5, each of the first shift register 101 and the second shift register 102 includes m flip-flops. The m flip-flops of the first shift register 101 may be denoted as a DFF_1 to a DFF_m, and the m flip-flops of the second shift register 102 may be denoted by a DFF_m+1 to a DFF_2m. Therefore, output ends Q of any n flip-flops DFF_1 to DFF_n in the DFF_1 to the DFF_m are respectively used as the n output ends Q1 to Qn of the first shift register 101. Output ends Q of any n flip-flops DFF_m+1 to DFF_m+n in the DFF_m+1 to the DFF_2m are respectively used as the n output ends Qn+1 to Q2n of the second shift register 102, where m is a positive integer greater than or equal to n.

It should be noted that, because the first shift register 101 includes m flip-flops, the initial value of the first shift register 101 includes m initial values of data input ends of the m flip-flops in the first shift register 101. Similarly, the initial value of the second shift register 102 includes m initial values of data input ends D of the m flip-flops in the second shift register 102.

In addition, as shown in FIG. 5, the first shift register 101 further includes m data processing circuits. Similarly, the second shift register 102 further includes m data processing circuits. The data input end D of each of the flip-flops is correspondingly connected to an output end of one data processing circuit, and a trigger input end C of each of the flip-flops is configured to receive the clock signal CLK2, to update data at the data input end with data at the output end.

Based on the random data generation circuit 100 shown in FIG. 5, each flip-flop is configured to output 1-bit data in a clock cycle of the clock signal CLK2. Therefore, in a clock cycle, the first shift register 101 may output n bits of data by using Q1 to Qn, and the second shift register 102 may output n bits of data by using Qn+1 to Q2n, so that the random data generation circuit 100 may output 2n bits of data.

Each of the data processing circuits is configured to perform logical processing on output data of at least one flip-flop, and an input end of the data processing circuit may be connected to the output end Q of any one or more flip-flops. The logical processing herein may be any logical processing, and a relationship between output data and input data of the data processing circuit may be flexible, so that the output data of the data processing circuit and the input data of the data processing circuit are different but are associated with each other. In this way, diversity of the output data of the data processing circuit can be improved, thereby improving diversity of data generated by the random data generation circuit 100.

To enable the data processing circuit to implement the logical processing, the data processing circuit may include one or more any logic gates, and these logic gates are connected in any manner. For example, the data processing circuit may include but is not limited to at least one of the following logic gates: an exclusive-NOR gate, an AND gate, an exclusive-OR gate, or a gate. When the data processing circuit includes different logic gates and/or logic gates are connected in different manners, the data processing circuit is enabled to implement different logical processing. For example, when the data processing circuit is obtained by cascading exclusive-OR gates, the data processing circuit may be configured to determine whether output data of the flip-flops is the same, and may output a high-level signal if the output data is the same, or may generate a low-level signal if the output data is different.

It may be understood that, as a quantity of logic gates increases and complexity of a connection relationship increases, diversity of the output data of the data processing circuit is improved. However, more logic gates and/or a more complex connection relationship may lead to relatively high operation complexity of the data processing circuit, relatively long processing duration, and relatively low processing efficiency, causing a relatively low data generation speed. Based on this, to balance operation complexity and diversity, the data processing circuit may be obtained by cascading exclusive-OR gates. Exclusive-OR gate cascading can not only ensure relatively small operation complexity, but also appropriately improve data diversity.

The parallel-to-serial circuit 103 may be disposed with 2n input ends, and the 2n input ends are respectively connected to the n output ends Q1 to Qn of the first shift register 101 and the n output ends Qm+1 to Qm+n of the second shift register 102. In this way, parallel data output by the n output ends Q1 to Qn of the first shift register 101 and parallel data generated by the n output ends Qm+1 to Qm+n of the second shift register 102 may be input to the parallel-to-serial circuit 103 through the connection, so that the parallel-to-serial circuit 103 converts the parallel data into serial data for output.

In the process of generating data by the random data generation circuit 100, first, each time the clock signal CLK2 is switched, each of the flip-flops in the first shift register 101 receives data from the output end connected to the data input end D of the flip-flop and updates the data to the data input end D of the flip-flop, and each of the flip-flops in the second shift register 102 receives data from an output end connected to the data input end D of the flip-flop and updates the data to the data input end D of the flip-flop, where the input data is output data of the data processing circuit. In addition, the n flip-flops DFF_1 to DFF_n of the first shift register 101 output data at the data input ends D of the DFF_1 to the DFF_n to the parallel-to-serial circuit 103 in parallel by using the output ends Q1 to Qn, and the n flip-flops DFF_m+1 to DFF_m+n in the second shift register 102 outputs data at the data input ends D of the DFF_m+1 to the DFF_m+n to the parallel-to-serial circuit 103 in parallel by using the output ends Qm+1 to Qm+n. Then, the parallel-to-serial circuit 103 converts the received 2n bits of parallel data into serial data for output.

It should be noted that n and m in this embodiment of this invention may be flexibly selected based on an actual invention scenario. When n have different values, data generation speeds are different, so that n may be adjusted to flexibly adjust a data generation speed. When m has different values, the random data generation circuit 100 has different sizes, so that m may be adjusted to flexibly adjust a size of the random data generation circuit 100.

In some embodiments, m may be 8 and n may be 4. In other words, each of the first shift register 101 and the second shift register 102 shown in FIG. 5 includes eight flip-flops, and the random data generation circuit 100 may include 16 flip-flops. In addition, output ends of four flip-flops in the first shift register 101 may be used as the output ends of the first shift register 101, and output ends of four flip-flops in the second shift register 102 may be used as the output ends of the second shift register 102. In this way, 8 bits of data may be output in a clock cycle of the clock signal CLK2 compared with the LFSR shown in FIG. 1, so that a data generation speed is increased by 8 times.

In some embodiments, when m is 8 and n is 4, the eight flip-flops of the first shift register 101 are successively denoted as a first flip-flop DFF_1 to an eighth flip-flop DFF_8, and the eight data processing circuits of the first shift register 101 are successively denoted as a first data processing circuit to an eighth data processing circuit. Output ends Q of the first flip-flop DFF_1 to the fourth flip-flop DFF_4 are successively the output ends Q1 to Q4.

Correspondingly, the eight flip-flops of the second shift register 102 are successively denoted as a ninth flip-flop DFF_9 to a sixteenth flip-flop DFF_16, and the eight data processing circuits of the second shift register 102 are successively denoted as a ninth data processing circuit to a sixteenth data processing circuit. Output ends Q of the ninth flip-flop DFF_9 to the twelfth flip-flop DFF_12 are successively the output ends Q5 to Q8.

Figure 6:
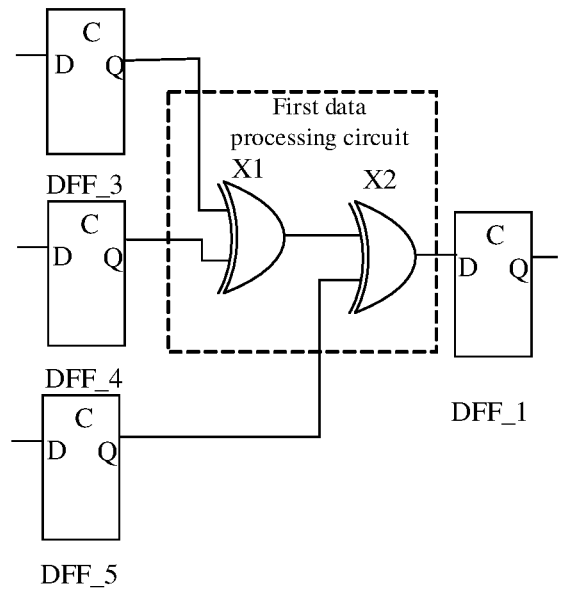
FIG. 6 to FIG. 13 are schematic diagrams of structures of a first data processing circuit to an eighth data processing circuit according to an embodiment of this invention.

In some embodiments, the first data processing circuit has three input ends. FIG. 6 is a schematic diagram of a structure of the first data processing circuit according to an embodiment of this invention. As shown in FIG. 6, the first data processing circuit is separately connected to the output ends Q of the third flip-flop DFF_3 to the fifth flip-flop DFF_5 and configured to perform exclusive OR processing on input data received by the three input ends of the first data processing circuit. Further, each time the clock signal CLK2 is switched, the first data processing circuit performs exclusive OR processing on output data of the third flip-flop DFF_3 to the fifth flip-flop DFF_5, and data obtained through exclusive OR processing is input to the data input end D of the first flip-flop DFF_1.

As shown in FIG. 6, the first data processing circuit is obtained by cascading two exclusive-OR gates. Two input ends of one exclusive-OR gate X1 are respectively connected to the output end Q of the third flip-flop DFF_3 and the output end Q of the fourth flip-flop DFF_4, two input ends of the other exclusive-OR gate X2 are respectively connected to an output end of the exclusive-OR gate X1 and the output end Q of the fifth flip-flop DFF_5, and an output end of X2 is connected to the data input end D of the DFF_1.

In this embodiment of this invention, a result of exclusive OR operation for data at the data input ends D of the DFF_3, the DFF_4, and the DFF_5 may be updated to the data input end D of the DFF_1 by using the first data processing circuit, so that update of data at the data input end D of the DFF_1 in one clock cycle is consistent with update of data at the data input end D of the DFF_1 in the LFSR in FIG. 1 in eight clock cycles. In other words, the data input end D of the DFF_1 in FIG. 6 can reach, in one clock cycle, a state that the data input end D of the DFF_1 in FIG. 1 reaches in eight clock cycles. In this way, when the random data generation circuit 100 has eight output ends, data output by the DFF_1 is data output by the DFF_1 in FIG. 1 every eight clock cycles, and data output in the seven intermediate clock cycles is output by the remaining seven output ends.

Similarly, the ninth data processing circuit has three input ends, which are respectively connected to the output ends of the eleventh flip-flop to the thirteenth flip-flop and configured to perform exclusive OR processing on input data received by the three input ends of the ninth data processing circuit. Further, each time the clock signal CLK2 is switched, the ninth data processing circuit performs exclusive OR processing on output data of the eleventh flip-flop DFF_11 to the thirteenth flip-flop DFF_13, and data obtained through exclusive OR processing is input to the data input end D of the ninth flip-flop DFF_9. For a structure and a connection relationship of the ninth data processing circuit, refer to the structure and the connection relationship shown in FIG. 6. The ninth data processing circuit updates the data input end D of the ninth flip-flop DFF_9 by using the same principle, and details are not described herein again.

Figure 7:
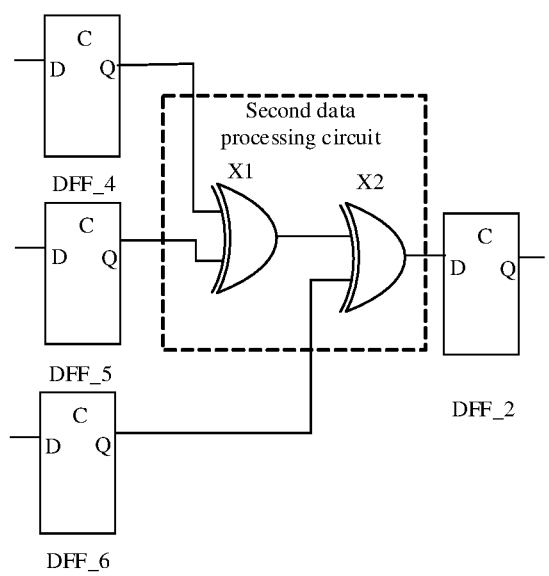

In some embodiments, the second data processing circuit has three input ends. FIG. 7 is a schematic diagram of a structure of the second data processing circuit according to an embodiment of this invention. As shown in FIG. 7, the second data processing circuit is separately connected to the output ends of the fourth flip-flop to the sixth flip-flop and configured to perform exclusive OR processing on input data received by the three input ends of the second data processing circuit. Further, each time the clock signal CLK2 is switched, the second data processing circuit performs exclusive OR processing on output data of the fourth flip-flop DFF_4 to the sixth flip-flop DFF_6, and data obtained through exclusive OR processing is input to the data input end D of the second flip-flop DFF_2.

As shown in FIG. 7, the second data processing circuit is obtained by cascading two exclusive-OR gates. Two input ends of one exclusive-OR gate X1 are respectively connected to the output end Q of the fourth flip-flop DFF_4 and the output end Q of the fifth flip-flop DFF_5, two input ends of the other exclusive-OR gate X2 are respectively connected to an output end of the exclusive-OR gate X1 and the output end Q of the sixth flip-flop DFF_6, and an output end of X2 is connected to the data input end D of the DFF_2.

In this embodiment of this invention, a result of exclusive OR operation for data at the data input ends D of the DFF_4, the DFF_5, and the DFF_6 may be updated to the data input end D of the DFF_2 by using the second data processing circuit, so that update of data at the data input end D of the DFF_2 in one clock cycle is consistent with update of data at the data input end D of the DFF_2 in the LFSR in FIG. 1 in eight clock cycles. In other words, the data input end D of the DFF_2 in FIG. 7 can reach, in one clock cycle, a state that the data input end D of the DFF_2 in FIG. 1 reaches in eight clock cycles. In this way, when the random data generation circuit 100 has eight output ends, data output by the DFF_2 is data output by the DFF_2 in FIG. 1 every eight clock cycles, and data output in the seven intermediate clock cycles is output by the remaining seven output ends.

Similarly, the tenth data processing circuit has three input ends, which are respectively connected to the output ends of the twelfth flip-flop to the fourteenth flip-flop and configured to perform exclusive OR processing on input data received by the three input ends of the tenth data processing circuit. Further, each time the clock signal CLK2 is switched, the tenth data processing circuit performs exclusive OR processing on output data of the twelfth flip-flop DFF_12 to the fourteenth flip-flop DFF_14, and data obtained through exclusive OR processing is input to the data input end D of the tenth flip-flop DFF_10. For a structure and a connection relationship of the tenth data processing circuit, refer to the structure and the connection relationship shown in FIG. 7. The tenth data processing circuit updates the data input end D of the tenth flip-flop DFF_10 by using the same principle, and details are not described herein again.

Figure 8:
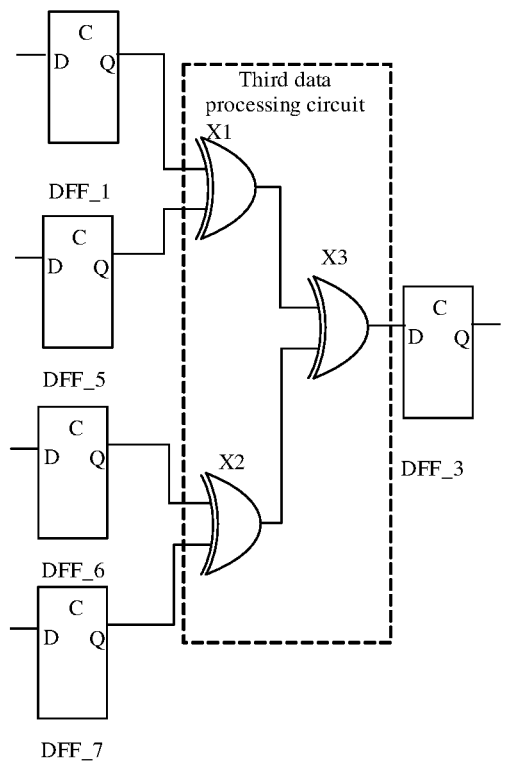

In some embodiments, the third data processing circuit has four input ends. FIG. 8 is a schematic diagram of a structure of the third data processing circuit according to an embodiment of this invention. As shown in FIG. 8, the third data processing circuit is separately connected to the output ends of the first flip-flop and the fifth flip-flop to the seventh flip-flop and configured to perform exclusive OR processing on input data received by the four input ends of the third data processing circuit. Further, each time the clock signal CLK2 is switched, the third data processing circuit performs exclusive OR processing on output data of the first flip-flop DFF_1 and the fifth flip-flop DFF_5 to the seventh flip-flop DFF_7, and data obtained through exclusive OR processing is input to the data input end D of the third flip-flop DFF_3.

As shown in FIG. 8, the third data processing circuit is obtained by cascading three exclusive-OR gates. Two input ends of an exclusive-OR gate X1 are respectively connected to the output end Q of the first flip-flop DFF_1 and the output end Q of the fifth flip-flop DFF_5, two input ends of an exclusive-OR gate X2 are respectively connected to the output end Q of the sixth flip-flop DFF_6 and the output end Q of the seventh flip-flop DFF_7, two input ends of an exclusive-OR gate X3 are respectively connected to an output end of the exclusive-OR gate X1 and an output end of X2, and an output end of the exclusive-OR gate X3 is connected to the data input end D of the DFF_3.

In this embodiment of this invention, a result of exclusive OR operation for data at the data input ends D of the DFF_1 and the DFF_5 to the DFF_7 may be updated to the data input end D of the DFF_3 by using the third data processing circuit, so that update of data at the data input end D of the DFF_3 in one clock cycle is consistent with update of data at the data input end D of the DFF_3 in the LFSR in FIG. 1 in eight clock cycles. In other words, the data input end D of the DFF_3 in FIG. 8 can reach, in one clock cycle, a state that the data input end D of the DFF_3 in FIG. 1 reaches in eight clock cycles. In this way, when the random data generation circuit 100 has eight output ends, data output by the DFF_3 is data output by the DFF_3 in FIG. 1 every eight clock cycles, and data output in the seven intermediate clock cycles is output by the remaining seven output ends.

Similarly, the eleventh data processing circuit has four input ends, which are respectively connected to the output ends of the ninth flip-flop and the thirteenth flip-flop to the fifteenth flip-flop and configured to perform exclusive OR processing on input data received by the four input ends of the eleventh data processing circuit. Further, each time the clock signal CLK2 is switched, the eleventh data processing circuit performs exclusive OR processing on output data of the ninth flip-flop DFF_9 and the thirteenth flip-flop to the fifteenth flip-flop, and data obtained through exclusive OR processing is input to the data input end D of the eleventh flip-flop DFF_11. For a structure and a connection relationship of the eleventh data processing circuit, refer to the structure and the connection relationship shown in FIG. 8. The eleventh data processing circuit updates the data input end D of the eleventh flip-flop DFF_11 by using the same principle, and details are not described herein again.

Figure 9:
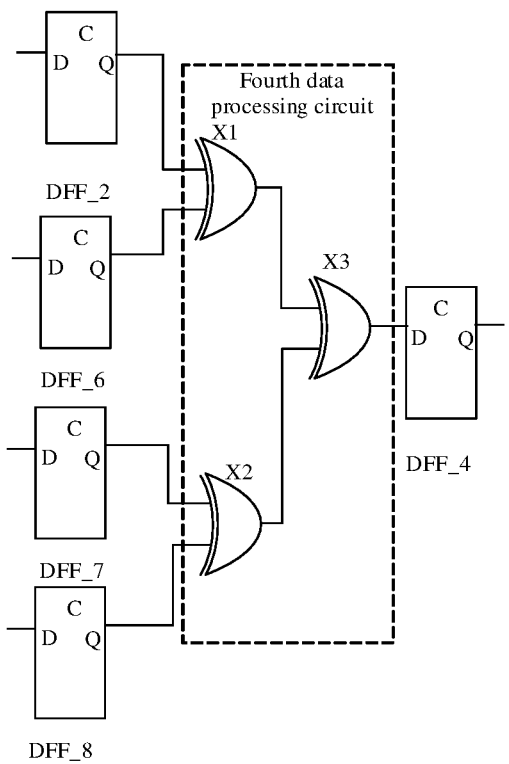

In some embodiments, the fourth data processing circuit has four input ends. FIG. 9 is a schematic diagram of a structure of the fourth data processing circuit according to an embodiment of this invention. As shown in FIG. 9, the fourth data processing circuit is separately connected to the output ends of the second flip-flop and the sixth flip-flop to the eighth flip-flop and configured to perform exclusive OR processing on input data received by the four input ends of the fourth data processing circuit. Further, each time the clock signal CLK2 is switched, the fourth data processing circuit performs exclusive OR processing on output data of the second flip-flop DFF_2 and the sixth flip-flop DFF_6 to the eighth flip-flop DFF_8, and data obtained through exclusive OR processing is input to the data input end D of the fourth flip-flop DFF_4.

As shown in FIG. 9, the fourth data processing circuit is obtained by cascading three exclusive-OR gates. Two input ends of an exclusive-OR gate X1 are respectively connected to the output end Q of the second flip-flop DFF_2 and the output end Q of the sixth flip-flop DFF_6 two input ends of an exclusive-OR gate X2 are respectively connected to the output end Q of the seventh flip-flop DFF_7 and the output end Q of the eighth flip-flop DFF_8, two input ends of an exclusive-OR gate X3 are respectively connected to an output end of the exclusive-OR gate X1 and an output end of X2, and an output end of the exclusive-OR gate X3 is connected to the data input end D of the DFF_4.

In this embodiment of this invention, a result of exclusive OR operation for data at the data input ends D of the DFF_2 and the DFF_6 to the DFF_8 may be updated to the data input end D of the DFF_4 by using the fourth data processing circuit, so that update of data at the data input end D of the DFF_4 in one clock cycle is consistent with update of data at the data input end D of the DFF_4 in the LFSR in FIG. 1 in eight clock cycles. In other words, the data input end D of the DFF_4 in FIG. 9 can reach, in one clock cycle, a state that the data input end D of the DFF_4 in FIG. 1 reaches in eight clock cycles. In this way, when the random data generation circuit 100 has eight output ends, data output by the DFF_4 is data output by the DFF_4 in FIG. 1 every eight clock cycles, and data output in the seven intermediate clock cycles is output by the remaining seven output ends.

Similarly, the twelfth data processing circuit has four input ends, which are respectively connected to the output ends of the tenth flip-flop and the fourteenth flip-flop to the sixteenth flip-flop and configured to perform exclusive OR processing on input data received by the four input ends of the twelfth data processing circuit. Further, each time the clock signal CLK2 is switched, the twelfth data processing circuit performs exclusive OR processing on output data of the tenth flip-flop DFF_10 and the fourteenth flip-flop DFF_14 to the sixteenth flip-flop DFF_16, and data obtained through exclusive OR processing is input to the data input end D of the twelfth flip-flop DFF_12. For a structure and a connection relationship of the twelfth data processing circuit, refer to the structure and the connection relationship shown in FIG. 9. The twelfth data processing circuit updates the data input end D of the twelfth flip-flop DFF_12 by using the same principle, and details are not described herein again.

Figure 10:
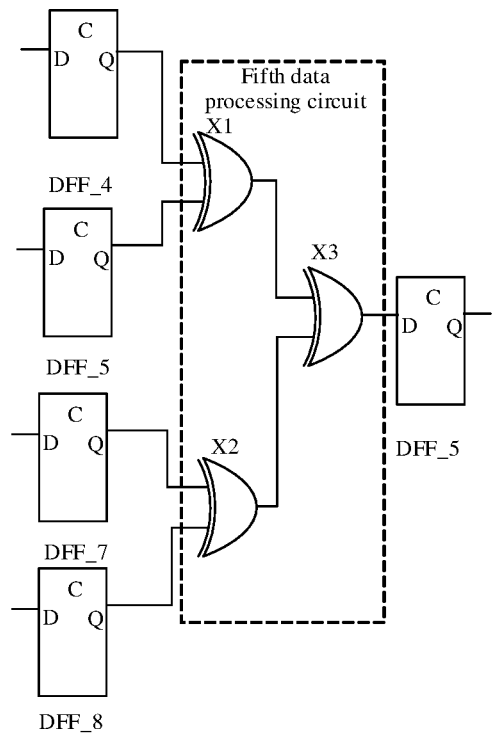

In some embodiments, the fifth data processing circuit has four input ends. FIG. 10 is a schematic diagram of a structure of the fifth data processing circuit according to an embodiment of this invention. As shown in FIG. 10, the fifth data processing circuit is separately connected to the output ends of the fourth flip-flop, the fifth flip-flop, the seventh flip-flop, and the eighth flip-flop and configured to perform exclusive OR processing on input data received by the four input ends of the fifth data processing circuit. Further, each time the clock signal CLK2 is switched, the fifth data processing circuit performs exclusive OR processing on output data of the fourth flip-flop DFF_4, the fifth flip-flop DFF_5, the seventh flip-flop DFF_7, and the eighth flip-flop, and data obtained through exclusive OR processing is input to the data input end D of the fifth flip-flop DFF_5.

As shown in FIG. 10, the fifth data processing circuit is obtained by cascading three exclusive-OR gates. Two input ends of an exclusive-OR gate X1 are respectively connected to the output end Q of the fourth flip-flop DFF_4 and the output end Q of the fifth flip-flop DFF_5, two input ends of an exclusive-OR gate X2 are respectively connected to the output end Q of the seventh flip-flop DFF_7 and the output end Q of the eighth flip-flop DFF_8, two input ends of an exclusive-OR gate X3 are respectively connected to an output end of the exclusive-OR gate X1 and an output end of X2, and an output end of the exclusive-OR gate X3 is connected to the data input end D of the DFF_5.

In this embodiment of this invention, a result of exclusive OR operation for data at the data input ends of the DFF_4, the DFF_5, the DFF_7, and the DFF_8 may be input to the data input end D of the DFF_5 by using the fifth data processing circuit, so that update of data at the data input end D of the DFF_5 in one clock cycle is consistent with update of data at the data input end D of the DFF_5 in the LFSR in FIG. 1 in eight clock cycles. In other words, the data input end D of the DFF_5 in FIG. 10 can reach, in one clock cycle, a state that the data input end D of the DFF_5 in FIG. 1 reaches in eight clock cycles. The data at the data input end D of the DFF_5 is not used as output data of the first shift register 101.

Similarly, the thirteenth data processing circuit has four input ends, which are respectively connected to the output ends of the twelfth flip-flop, the thirteenth flip-flop, the fifteenth flip-flop, and the sixteenth flip-flop and configured to perform exclusive OR processing on input data received by the four input ends of the thirteenth data processing circuit. Further, each time the clock signal CLK2 is switched, the thirteenth data processing circuit performs exclusive OR processing on output data of the twelfth flip-flop, the thirteenth flip-flop, the fifteenth flip-flop, and the sixteenth flip-flop, and data obtained through exclusive OR processing is input to the data input end D of the thirteenth flip-flop DFF_13. For a structure and a connection relationship of the thirteenth data processing circuit, refer to the structure and the connection relationship shown in FIG. 10. The thirteenth data processing circuit updates the data input end D of the thirteenth flip-flop DFF_13 by using the same principle, and details are not described herein again.

Figure 11:
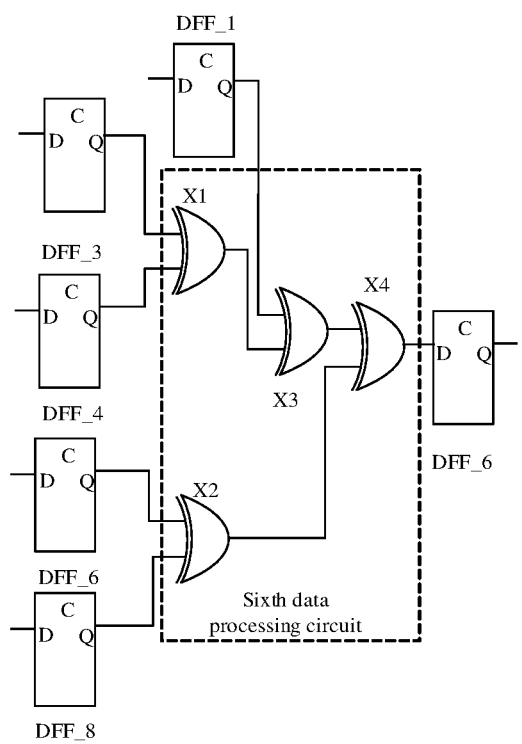

In some embodiments, the sixth data processing circuit has five input ends. FIG. 11 is a schematic diagram of a structure of the sixth data processing circuit according to an embodiment of this invention. As shown in FIG. 11, the sixth data processing circuit is separately connected to the output ends Q of the first flip-flop, the third flip-flop, the fourth flip-flop, the sixth flip-flop, and the eighth flip-flop and configured to perform exclusive OR processing on input data received by the five input ends of the sixth data processing circuit. Further, each time the clock signal CLK2 is switched, the sixth data processing circuit performs exclusive OR processing on output data of the first flip-flop, the third flip-flop, the fourth flip-flop, the sixth flip-flop, and the eighth flip-flop, and data obtained through exclusive OR processing is input to the data input end D of the sixth flip-flop DFF_6.

As shown in FIG. 11, the sixth data processing circuit is obtained by cascading four exclusive-OR gates. Two input ends of an exclusive-OR gate X1 are respectively connected to the output end Q of the third flip-flop DFF_3 and the output end Q of the fourth flip-flop DFF_4, two input ends of an exclusive-OR gate X2 are respectively connected to the output end Q of the sixth flip-flop DFF_6 and the output end Q of the eighth flip-flop DFF_8, two input ends of an exclusive-OR gate X3 are respectively connected to an output end of the exclusive-OR gate X1 and the output end Q of the first flip-flop DFF_1, two input ends of an exclusive-OR gate X4 are respectively connected to an output end of the exclusive-OR gate X2 and an output end of X3, and an output end of the exclusive-OR gate X4 is connected to the data input end D of the DFF_6.

In this embodiment of this invention, a result of exclusive OR operation for data at the data input ends D of the DFF_1, the DFF_3, the DFF_4, the DFF_6, and the DFF_8 may be updated to the data input end D of the DFF_6 by using the sixth data processing circuit, so that update of data at the data input end D of the DFF_6 in one clock cycle is consistent with update of data at the data input end D of the DFF_6 in the LFSR in FIG. 1 in eight clock cycles. In other words, the data input end D of the DFF_6 in FIG. 11 can reach, in one clock cycle, a state that the data input end D of the DFF_6 in FIG. 1 reaches in eight clock cycles. The data at the data input end of the DFF_6 is not used as output data of the first shift register 101.

Similarly, the fourteenth data processing circuit has five input ends, which are respectively connected to the output ends of the ninth flip-flop, the eleventh flip-flop, the twelfth flip-flop, the fourteenth flip-flop, and the sixteenth flip-flop and configured to perform exclusive OR processing on input data received by the five input ends of the fourteenth data processing circuit. Further, each time the clock signal CLK2 is switched, the fourteenth data processing circuit performs exclusive OR processing on output data of the ninth flip-flop, the eleventh flip-flop, the twelfth flip-flop, the fourteenth flip-flop, and the sixteenth flip-flop, and data obtained through exclusive OR processing is input to the data input end D of the fourteenth flip-flop DFF_14. For a structure and a connection relationship of the fourteenth data processing circuit, refer to the structure and the connection relationship shown in FIG. 11. The fourteenth data processing circuit updates the data input end D of the fourteenth flip-flop DFF_14 by using the same principle, and details are not described herein again.

Figure 12:
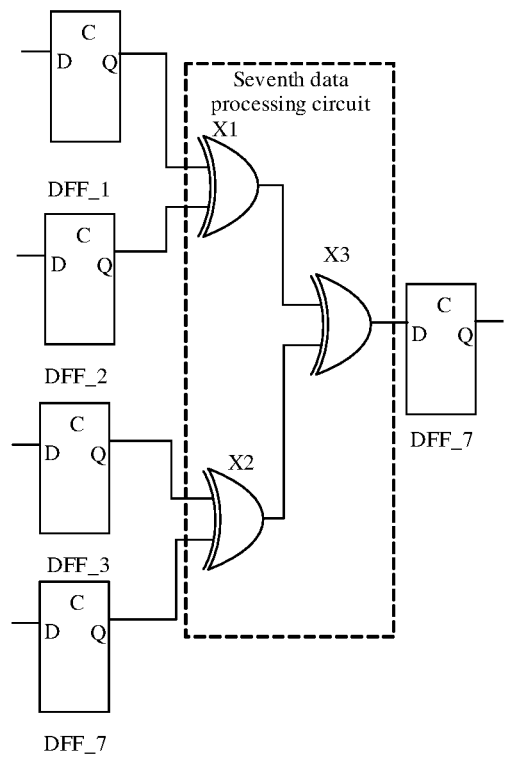

In some embodiments, the seventh data processing circuit has four input ends. FIG. 12 is a schematic diagram of a structure of the seventh data processing circuit according to an embodiment of this invention. As shown in FIG. 12, the seventh data processing circuit is separately connected to the output ends of the first flip-flop to the third flip-flop and the seventh flip-flop and configured to perform exclusive OR processing on input data received by the four input ends of the seventh data processing circuit. Further, each time the clock signal CLK2 is switched, the seventh data processing circuit performs exclusive OR processing on output data of the first flip-flop to the third flip-flop and the seventh flip-flop, and data obtained through exclusive OR processing is input to the data input end D of the seventh flip-flop DFF_7.

As shown in FIG. 12, the seventh data processing circuit is obtained by cascading three exclusive-OR gates. Two input ends of an exclusive-OR gate X1 are respectively connected to the output end Q of the first flip-flop DFF_1 and the output end Q of the second flip-flop DFF_2, two input ends of an exclusive-OR gate X2 are respectively connected to the output end Q of the third flip-flop DFF_3 and the output end Q of the seventh flip-flop DFF_7, two input ends of an exclusive-OR gate X3 are respectively connected to an output end of the exclusive-OR gate X1 and an output end of X2, and an output end of the exclusive-OR gate X3 is connected to the data input end D of the DFF_7.

In this embodiment of this invention, a result of exclusive OR operation for data at the data input ends D of the DFF_1 to the DFF_3 and the DFF_7 may be updated to the data input end D of the DFF_7 by using the seventh data processing circuit, so that update of data at the data input end D of the DFF_7 in one clock cycle is consistent with update of data at the data input end D of the DFF_7 in the LFSR in FIG. 1 in eight clock cycles. In other words, the data input end D of the DFF_7 in FIG. 12 can reach, in one clock cycle, a state that the data input end D of the DFF_7 in FIG. 1 reaches in eight clock cycles. The data at the data input end D of the DFF_7 is not used as output data of the first shift register 101.

Similarly, the fifteenth data processing circuit has four input ends, which are respectively connected to the output ends of the ninth flip-flop to the eleventh flip-flop and the fifteenth flip-flop and configured to perform exclusive OR processing on input data received by the four input ends of the fifteenth data processing circuit. Further, each time the clock signal CLK2 is switched, the fifteenth data processing circuit performs exclusive OR processing on output data of the ninth flip-flop to the eleventh flip-flop and the fifteenth flip-flop, and data obtained through exclusive OR processing is input to the data input end D of the fifteenth flip-flop DFF_15. For a structure and a connection relationship of the fifteenth data processing circuit, refer to the structure and the connection relationship shown in FIG. 12. The fifteenth data processing circuit updates the data input end D of the fifteenth flip-flop DFF_15 by using the same principle, and details are not described herein again.

Figure 13:
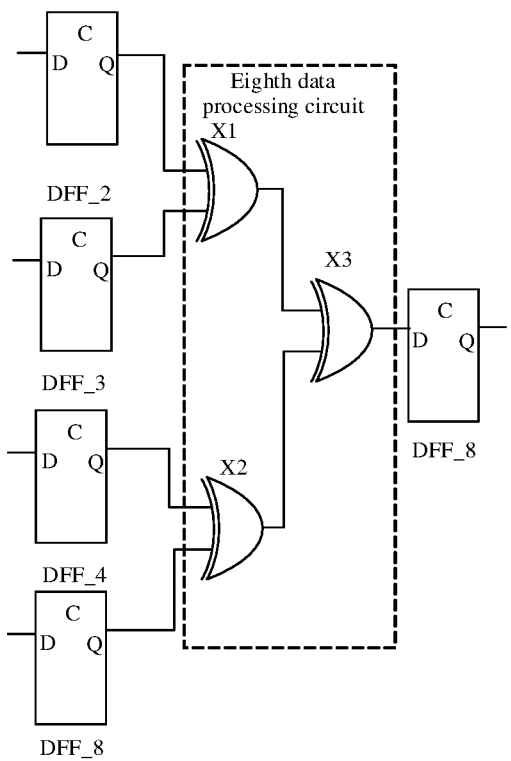

In some embodiments, the eighth data processing circuit has four input ends. FIG. 13 is a schematic diagram of a structure of the eighth data processing circuit according to an embodiment of this invention. As shown in FIG. 13, the eighth data processing circuit is separately connected to the output ends of the second flip-flop to the fourth flip-flop and the eighth flip-flop and configured to perform exclusive OR processing on input data received by the four input ends of the eighth data processing circuit. Further, each time the clock signal CLK2 is switched, the eighth data processing circuit performs exclusive OR processing on output data of the second flip-flop to the fourth flip-flop and the eighth flip-flop, and data obtained through exclusive OR processing is input to the data input end D of the eighth flip-flop DFF_8.

As shown in FIG. 13, the eighth data processing circuit is obtained by cascading three exclusive-OR gates. Two input ends of an exclusive-OR gate X1 are respectively connected to the output end Q of the second flip-flop DFF_2 and the output end Q of the third flip-flop DFF_3 two input ends of an exclusive-OR gate X2 are respectively connected to the output end Q of the fourth flip-flop DFF_4 and the output end Q of the eighth flip-flop DFF_8, two input ends of an exclusive-OR gate X3 are respectively connected to an output end of the exclusive-OR gate X1 and an output end of X2, and an output end of the exclusive-OR gate X3 is connected to the data input end D of the DFF_8.

In this embodiment of this invention, a result of exclusive OR operation for data at the data input ends D of the DFF_2 to the DFF_4 and the DFF_8 may be updated to the data input end D of the DFF_8 by using the eighth data processing circuit, so that update of data at the data input end D of the DFF_8 in one clock cycle is consistent with update of data at the data input end D of the DFF_8 in the LFSR in FIG. 1 in eight clock cycles. In other words, the data input end D of the DFF_8 in FIG. 13 can reach, in one clock cycle, a state that the data input end D of the DFF_8 in FIG. 1 reaches in eight clock cycles. The data at the data input end D of the DFF_8 is not used as output data of the first shift register 101.

Similarly, the sixteenth data processing circuit has four input ends, which are respectively connected to the output ends of the tenth flip-flop to the twelfth flip-flop and the sixteenth flip-flop and configured to perform exclusive OR processing on input data received by the four input ends of the sixteenth data processing circuit. Further, each time the clock signal CLK2 is switched, the sixteenth data processing circuit performs exclusive OR processing on output data of the tenth flip-flop to the twelfth flip-flop and the sixteenth flip-flop, and data obtained through exclusive OR processing is input to the data input end D of the sixteenth flip-flop DFF_16. The data input end D of the DFF_16 can reach, in one clock cycle, a state that the data input end D of the DFF_8 in FIG. 1 reaches in eight clock cycles. The sixteenth data processing circuit updates the data input end D of the sixteenth flip-flop DFF_16 by using the same principle, and details are not described herein again.

Figure 14:
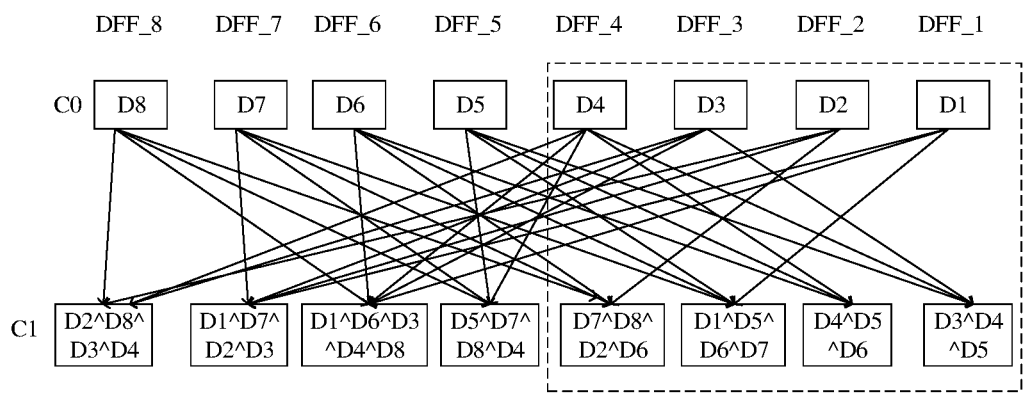
FIG. 14 is a schematic diagram of data at data input ends of flip-flops in a first shift register shown in FIG. 5 in different clock cycles according to an embodiment of this invention.
Figure 15:
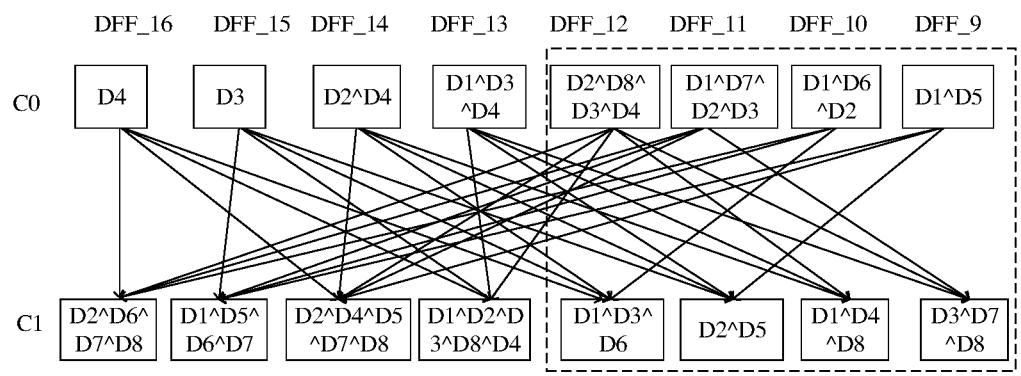
FIG. 15 is a schematic diagram of data at data input ends of flip-flops in a second shift register shown in FIG. 5 in different clock cycles according to an embodiment of this invention.

Data at the data input ends D of the flip-flops shown in FIG. 5 in any clock cycle may be determined based on the connection relationships shown in FIG. 5 to FIG. 13. FIG. 14 is a schematic diagram of data at the data input ends D of the flip-flops in the first shift register 101 shown in FIG. 5 in different clock cycles according to an embodiment of this invention. FIG. 15 is a schematic diagram of data at the data input ends D of the flip-flops in the second shift register 102 shown in FIG. 5 in different clock cycles according to an embodiment of this invention. It may be understood that the data shown in FIG. 14 and FIG. 15 is output data in a case in which m=8 and n=4.

As shown in FIG. 14, C0 may be an initial state. In the initial state C0, data at the data input ends D of the first flip-flop DFF_1 to the eighth flip-flop DFF_8 may be respectively denoted as D1 to D8. FIG. 14 shows a relationship between data at the data input ends D of the flip-flops DFF_1 to DFF_8 in a clock cycle C1 and the data D1 to D8 in the initial state C0.

It may be learned from the connection relationship shown in FIG. 6 that, in a current clock cycle, data at the data input end D of the DFF_1 is a result of exclusive OR operation for data at the data input ends D of the DFF_3 to the DFF_5 in a previous clock cycle. Therefore, in a next clock cycle C1 shown in FIG. 14, data at the data input end D of the first flip-flop DFF_1 is D3^D4^D5.

It may be learned from the connection relationship shown in FIG. 7 that, in a current clock cycle, data at the data input end D of the DFF_2 is a result of exclusive OR operation for data at the data input ends D of the DFF_4 to the DFF_6 in a previous clock cycle. Therefore, in a next clock cycle C1 shown in FIG. 14, data at the data input end D of the second flip-flop DFF_2 is D4^D5^D6.

It may be learned from the connection relationship shown in FIG. 8 that, in a current clock cycle, data at the data input end D of the DFF_3 is a result of exclusive OR operation for data at the data input ends D of the DFF_1 and the DFF_5 to the DFF_7 in a previous clock cycle. Therefore, in a next clock cycle C1 shown in FIG. 14, data at the data input end D of the third flip-flop DFF_3 is D1^D5^D6^D7.

It may be learned from the connection relationship shown in FIG. 9 that, in a current clock cycle, data at the data input end D of the DFF_4 is a result of exclusive OR operation for data at the data input ends D of the DFF_2 and the DFF_6 to the DFF_8 in a previous clock cycle. Therefore, in a next clock cycle C1 shown in FIG. 14, data at the data input end D of the fourth flip-flop DFF_4 is D7^D8^D2^D6.

It may be learned from the connection relationship shown in FIG. 10 that, in a current clock cycle, data at the data input end D of the DFF_5 is a result of exclusive OR operation for data at the data input ends D of the DFF_4, the DFF_5, the DFF_7, and the DFF_8 in a previous clock cycle. Therefore, in a next clock cycle C1 shown in FIG. 14, data at the data input end D of the fifth flip-flop DFF_5 is D4^D5^D7^D8.

It may be learned from the connection relationship shown in FIG. 11 that, in a current clock cycle, data at the data input end D of the DFF_6 is a result of exclusive OR operation for data at the data input ends D of the DFF_1, the DFF_3, the DFF_4, the DFF_6, and the DFF_8 in a previous clock cycle. Therefore, in a next clock cycle C1 shown in FIG. 14, data at the data input end D of the sixth flip-flop DFF_6 is D1^D3^D4^D6^D8.

It may be learned from the connection relationship shown in FIG. 12 that, in a current clock cycle, data at the data input end D of the DFF_7 is a result of exclusive OR operation for data at the data input ends D of the DFF_1 to the DFF_3 and the DFF_7 in a previous clock cycle. Therefore, in a next clock cycle C1 shown in FIG. 14, data at the data input end D of the seventh flip-flop DFF_7 is D1^D2^D3^D7.

It may be learned from the connection relationship shown in FIG. 13 that, in a current clock cycle, data at the data input end D of the DFF_8 is a result of exclusive OR operation for data at the data input ends D of the DFF_2 to the DFF_4 and the DFF_8 in a previous clock cycle. Therefore, in a next clock cycle C1 shown in FIG. 14, data at the data input end D of the eighth flip-flop DFF_8 is D2^D8^D3^D4.

Through comparison between data at the data input ends of the flip-flops shown in FIG. 14 and FIG. 2, data at the data input ends D of the flip-flops DFF_1 to DFF_8 in the clock cycle C1 shown in FIG. 14 is consistent with data at the data input ends D of the flip-flops DFF_1 to DFF_8 in the clock cycle C8 shown in FIG. 2. In other words, the first shift register 101 shown in FIG. 5 to FIG. 13 can reach, by using one clock cycle, a state of the LFSR shown in FIG. 1 in eight clock cycles. It may also be understood as that the random data generation circuit 100 in this embodiment of this invention may establish, by using the data processing circuit, a relationship between data at the data input ends D of the flip-flops in C8 in FIG. 2 and data at the data input ends D of the flip-flops in C0, so that data is updated and output eight clock cycles earlier.

Further, as shown in FIG. 2, data output by the LFSR circuit in FIG. 1 by using the DFF_1 is successively D1, D2, D3, D4, D1^D5, D1^D6^D2, D1^D7^D2^D3, and D2^D8^D3^D4.

As shown in FIG. 15, based on initial values of the data input ends D of the DFF_1 to the DFF_8, initial values of the data input ends D of the flip-flops DFF_9 to DFF_16 in the second shift register 102 in C0 are set to: D1^D5, D1^D6^D2, D1^D7^D2^D3, D2^D8^D3^D4, D1^D3^D4, D2^D4, D3, and D4. Therefore, as shown in FIG. 14, after clock switching is performed in the state C0, data output by the first shift register 101 by using the DFF_1 to the DFF_4 is successively D1, D2, D3, and D4. As shown in FIG. 15, after clock switching is performed in the state C0, data output by the second shift register 102 by using the DFF_9 to the DFF_12 is D1^D5, D1^D6^D2, D1^D7^D2^D3, and D2^D8^D3^D4. Therefore, data output by the random data generation circuit 100 after clock switching is performed in the state C0 is separately D1, D2, D3, D4, D1^D5, D1^D6^D2, D1^D7^D2^D3, and D2^D8^D3^D4, where the data is consistent with data output by the DFF_1 in the LFSR circuit shown in FIG. 2 after clock switching is performed in states C0 to C7.

As shown in FIG. 3, after clock switching is performed in states C8 to C15, data output by the LFSR circuit in FIG. 1 by using the DFF_1 is successively D3^D4^D5, D4^D5^D6, D1^D5^D6^D7, D7^D8^D2^D6, D3^D7^D8, D1^D4^D8, D2^D5, and D1^D3^D6.

As shown in FIG. 14, after clock switching is performed in the state C1, data output by the first shift register 101 by using the DFF_1 to the DFF_4 is D3^D4^D5, D4^D5^D6, D1^D5^D6^D7, and D7^D8^D2^D6. As shown in FIG. 15, data output by the second shift register 102 by using the DFF_9 to the DFF_12 is D3^D7^D8, D1^D4^D8, D2^D5, and D1^D3^D6. Therefore, data output by the random data generation circuit 100 after clock switching is performed in the state C0 is separately D3^D4^D5, D4^D5^D6, D1^D5^D6^D7, D7^D8^D2^D6, D3^D7^D8, D1^D4^D8, D2^D5, and D1^D3^D6, where the data is consistent with data output by the DFF_1 shown in FIG. 3 after clock switching is performed in states C8 to C15.

The state C1 in FIG. 14 and FIG. 15 may be understood as a new initial state of the random data generation circuit 100 for update in a next clock cycle. Data may be output continuously based on such a relationship, and a sequence of data output by the random data generation circuit 100 and the LFSR circuit is always the same.

In conclusion, the random data generation circuit 100 corresponding to the connection relationships shown in FIG. 5 to FIG. 13 includes 16 flip-flops, and can generate data with a same feature at a speed 8 times of that of the LFSR shown in FIG. 1 by using the DFF_1 to the DFF_4 and the DFF_9 to the DFF_16.

It should be noted that, m flip-flops are used in the random data generation circuit 100 in this embodiment of this invention, and each of the flip-flops stores 1-bit data. Therefore, there may be a maximum of $2^m$ pieces of data at the data input ends D of the m flip-flops. In this case, data output by two shift registers repeatedly appears in units of $2^m$ bits, and therefore data output by both the first shift register 101 and the second shift register 102 repeatedly appears in units of $2^{(m-1)}$ bits. Further, for a positive integer i greater than or equal to 1 and less than or equal to m−1, when the first shift register 101 generates random data by using a specific initial value, the $i^{th}$ bit of data output by the first shift register 101 is the same as the $(i+j\times 2^{(m-1)})^{th}$ bit of data output by the first shift register 101. Similarly, when the second shift register 102 generates random data by using a specific initial value, the $i^{th}$ bit of data output by the second shift register 102 is the same as the $(i+j\times 2^{(m-1)})^{th}$ bit of data output by the second shift register 102, where j is a positive integer greater than or equal to 1.

Based on the foregoing embodiment of the random data generation circuit 100, an embodiment of this invention further provides a read/write training circuit, including a data storage circuit and the random data generation circuit 100. The parallel-to-serial circuit 103 in the random data generation circuit 100 is connected to the data storage circuit and configured to input data generated by the random data generation circuit 100 to the data storage circuit for read/write training.

In some embodiments, the data storage circuit is an internal memory of DDR5.

The random data generation circuit 100 provided in the embodiments of this invention can improve a data generation speed, thereby improving a speed and efficiency of training the data storage circuit, thereby saving time.

Finally, it should be noted that the foregoing embodiments are merely used to describe the technical solutions of this invention but are not limited thereto. Although this invention is described in detail with reference to the foregoing embodiments, a person of ordinary skill in the art should understand that the technical solutions recorded in the foregoing embodiments may still be modified, or equivalently replace some or all technical features. However, these modifications or replacements do not make the essence of the corresponding technical solutions go beyond the scope of the technical solutions of the embodiments of this invention.

For ease of explanation, the foregoing descriptions are provided with reference to specific implementations. However, the foregoing example discussion is not intended to be exhaustive or limit the implementations to the specific forms disclosed above. According to the foregoing teachings, various modifications and variations may be obtained. The foregoing implementations are selected and described for a better explanation of a principle and an actual application, so that a person skilled in the art better uses the implementations and various variations of the implementations that are considered for specific use.

What is claimed is:

1. A random data generation circuit, comprising:
 a first shift register and a second shift register, configured to receive a same clock signal, wherein the first shift register comprises n output ends Q1 to Qn, the second shift register comprises n output ends Qn+1 to Q2n, each of the output ends outputs 1-bit data in a clock cycle of the clock signal, and n is an integer greater than or equal to 1; and
 a parallel-to-serial circuit, coupled to the output ends of the first shift register and the output ends of the second shift register and configured to convert parallel data output by the output ends Q1 to Q2n in one clock cycle into serial data for output,
 wherein an initial value of the first shift register is different from an initial value of the second shift register.

2. The random data generation circuit according to claim 1, wherein the first shift register is the same as the second shift register.

3. The random data generation circuit according to claim 2, wherein:
 each of the first shift register and the second shift register comprises m triggers and m data processing circuits,
 a data input end of each of the triggers is correspondingly connected to an output end of one data processing circuit,
 a trigger input end of each of the triggers is configured to receive the clock signal,
 each of the data processing circuits is configured to perform logical processing on output data of at least one trigger,
 output ends of n triggers in the first shift register are respectively used as the n output ends of the first shift register,
 output ends of n triggers in the second shift register are respectively used as the n output ends of the second shift register,
 m is a positive integer greater than or equal to n, and
 the initial value of the first shift register comprises an initial value of the data input ends of the triggers in the first shift register, and the initial value of the second shift register comprises an initial value of the data input ends of the triggers in the second shift register.

4. The random data generation circuit according to claim 3, wherein m is 8 and n is 4.

5. The random data generation circuit according to claim 4, wherein:
 the eight triggers of the first shift register are successively denoted as a first trigger to an eighth trigger, the eight data processing circuits of the first shift register are successively denoted as a first data processing circuit to an eighth data processing circuit, and output ends of the first trigger to the fourth trigger are successively the output ends Q1 to Q4; and
 the eight triggers of the second shift register are successively denoted as a ninth trigger to a sixteenth trigger, the eight data processing circuits of the second shift register are successively denoted as a ninth data processing circuit to a sixteenth data processing circuit, and output ends of the ninth trigger to the twelfth trigger are successively the output ends Q5 to Q8.

6. The random data generation circuit according to claim 5, wherein:
 the first data processing circuit has three input ends, which are respectively connected to the output ends of the third trigger to the fifth trigger and configured to perform exclusive OR processing on input data received by the three input ends of the first data processing circuit; and
 the ninth data processing circuit has three input ends, which are respectively connected to the output ends of the eleventh trigger to the thirteenth trigger and configured to perform exclusive OR processing on input data received by the three input ends of the ninth data processing circuit.

7. The random data generation circuit according to claim 5, wherein:
 the second data processing circuit has three input ends, which are respectively connected to the output ends of the fourth trigger to the sixth trigger and configured to perform exclusive OR processing on input data received by the three input ends of the second data processing circuit; and the tenth data processing circuit has three input ends, which are respectively connected to the output ends of the twelfth trigger to the fourteenth trigger and configured to perform exclusive OR processing on input data received by the three input ends of the tenth data processing circuit.

8. The random data generation circuit according to claim 5, wherein:

the third data processing circuit has four input ends, which are respectively connected to the output ends of the first trigger and the fifth trigger to the seventh trigger and configured to perform exclusive OR processing on input data received by the four input ends of the third data processing circuit; and the eleventh data processing circuit has four input ends, which are respectively connected to the output ends of the ninth trigger and the thirteenth trigger to the fifteenth trigger and configured to perform exclusive OR processing on input data received by the four input ends of the eleventh data processing circuit.

9. The random data generation circuit according to claim 5, wherein:

the fourth data processing circuit has four input ends, which are respectively connected to the output ends of the second trigger and the sixth trigger to the eighth trigger and configured to perform exclusive OR processing on input data received by the four input ends of the fourth data processing circuit; and the twelfth data processing circuit has four input ends, which are respectively connected to the output ends of the tenth trigger and the fourteenth trigger to the sixteenth trigger and configured to perform exclusive OR processing on input data received by the four input ends of the twelfth data processing circuit.

10. The random data generation circuit according to claim 5, wherein:

the fifth data processing circuit has four input ends, which are respectively connected to the output ends of the fourth trigger, the fifth trigger, the seventh trigger, and the eighth trigger and configured to perform exclusive OR processing on input data received by the four input ends of the fifth data processing circuit; and the thirteenth data processing circuit has four input ends, which are respectively connected to the output ends of the twelfth trigger, the thirteenth trigger, the fifteenth trigger, and the sixteenth trigger and configured to perform exclusive OR processing on input data received by the four input ends of the thirteenth data processing circuit.

11. The random data generation circuit according to claim 5, wherein:

the sixth data processing circuit has five input ends, which are respectively connected to the output ends of the first trigger, the third trigger, the fourth trigger, the sixth trigger, and the eighth trigger and configured to perform exclusive OR processing on input data received by the five input ends of the sixth data processing circuit; and the fourteenth data processing circuit has five input ends, which are respectively connected to the output ends of the ninth trigger, the eleventh trigger, the twelfth trigger, the fourteenth trigger, and the sixteenth trigger and configured to perform exclusive OR processing on input data received by the five input ends of the fourteenth data processing circuit.

12. The random data generation circuit according to claim 5, wherein:

the seventh data processing circuit has four input ends, which are respectively connected to the output ends of the first trigger to the third trigger and the seventh trigger and configured to perform exclusive OR processing on input data received by the four input ends of the seventh data processing circuit; and the fifteenth data processing circuit has four input ends, which are respectively connected to the output ends of the ninth trigger to the eleventh trigger and the fifteenth trigger and configured to perform exclusive OR processing on input data received by the four input ends of the fifteenth data processing circuit.

13. The random data generation circuit according to claim 5, wherein:

the eighth data processing circuit has four input ends, which are respectively connected to the output ends of the second trigger to the fourth trigger and the eighth trigger and configured to perform exclusive OR processing on input data received by the four input ends of the eighth data processing circuit; and the sixteenth data processing circuit has four input ends, which are respectively connected to the output ends of the tenth trigger to the twelfth trigger and the sixteenth trigger and configured to perform exclusive OR processing on input data received by the four input ends of the sixteenth data processing circuit.

14. The random data generation circuit according to claim 3, wherein data output by both the first shift register and the second shift register repeatedly appear in units of $2^{(m-1)}$ bits.

15. The random data generation circuit according to claim 5, wherein:

an initial value of the data input end of the ninth trigger is a result of exclusive OR operation for an initial value of the data input end of the first trigger and an initial value of the data input end of the fifth trigger;

an initial value of the data input end of the tenth trigger is a result of exclusive OR operation for the initial value of the data input end of the first trigger, an initial value of the data input end of the second trigger, and an initial value of the data input end of the sixth trigger;

an initial value of the data input end of the eleventh trigger is a result of exclusive OR operation for the initial value of the data input end of the first trigger, the initial value of the data input end of the second trigger, an initial value of the data input end of the third trigger, and an initial value of the data input end of the seventh trigger;

an initial value of the data input end of the twelfth trigger is a result of exclusive OR operation for the initial value of the data input end of the second trigger, the initial value of the data input end of the third trigger, an initial value of the data input end of the fourth trigger, and an initial value of the data input end of the eighth trigger;

an initial value of the data input end of the thirteenth trigger is a result of exclusive OR operation for the initial value of the data input end of the first trigger, the initial value of the data input end of the third trigger, and the initial value of the data input end of the fourth trigger;

an initial value of the data input end of the fourteenth trigger is a result of exclusive OR operation for the initial value of the data input end of the second trigger and the initial value of the data input end of the fourth trigger;

an initial value of the data input end of the fifteenth trigger is the initial value of the data input end of the third trigger; and an initial value of the data input end of the sixteenth trigger is the initial value of the data input end of the fourth trigger.

16. A read/write training circuit, comprising a data storage circuit and the random data generation circuit according to claim 1, wherein the parallel-to-serial circuit in the random data generation circuit is connected to the data storage circuit and configured to input data generated by the random data generation circuit to the data storage circuit for read/write training.

17. The read/write training circuit according to claim 16, wherein the data storage circuit is an internal memory of a DDR5 memory device.

* * * * *